United States Patent [19]

Shamshoian

[11] Patent Number: 4,891,247
[45] Date of Patent: Jan. 2, 1990

[54] PROCESS FOR BOROSILICATE GLASS FILMS FOR MULTILEVEL METALLIZATION STRUCTURES IN SEMICONDUCTOR DEVICES

[75] Inventor: Peter C. Shamshoian, Aptos, Calif.
[73] Assignee: Watkins-Johnson Company, Palo Alto, Calif.
[21] Appl. No.: 214,909
[22] Filed: Jun. 29, 1988

Related U.S. Application Data

[63] Continuation of Ser. No. 907,503, Sep. 15, 1986, abandoned.

[51] Int. Cl.⁴ ............................................. C23C 16/30
[52] U.S. Cl. ................................ 427/255.3; 427/255; 437/236; 437/243
[58] Field of Search .................. 427/255.2, 255, 255.3; 437/235, 243, 67, 236

[56] References Cited

U.S. PATENT DOCUMENTS

| | | | |
|---|---|---|---|
| 4,369,031 | 1/1983 | Goldman | 118/724 |
| 4,546,016 | 10/1985 | Kern | 427/255.3 |
| 4,556,585 | 12/1985 | Abernathy | 437/67 |
| 4,557,950 | 12/1985 | Foster | 437/67 |
| 4,601,781 | 7/1986 | Mercier | 437/238 |

FOREIGN PATENT DOCUMENTS 159786  4/1983  Fed. Rep. of Germany ...... 437/238

OTHER PUBLICATIONS

Winkle, "Improved Atmospheric-Pressure CVD System for Depositing Silica and Phosphosilicate Glass Thin Films", Solid State Technology, pp. 123-128, vol. 24, No. 10, Oct., 1981.

Primary Examiner—Sadie Childs
Attorney, Agent, or Firm—Flehr, Hohbach, Test, Albritton & Herbert

[57] ABSTRACT

A process for forming a borosilicate glass layer on a sharply profiled surface of a semiconductor device comprising the steps of: heating the device; conveying the device through a deposition chamber at atmospheric pressure; directing silane gas, diborane gas, and oxygen into the chamber and the surface of the heated device where they react and form a borosilicate glass layer on the surface so that smooth corners are formed for the sharply profiled surface of the semiconductor device.

5 Claims, 2 Drawing Sheets

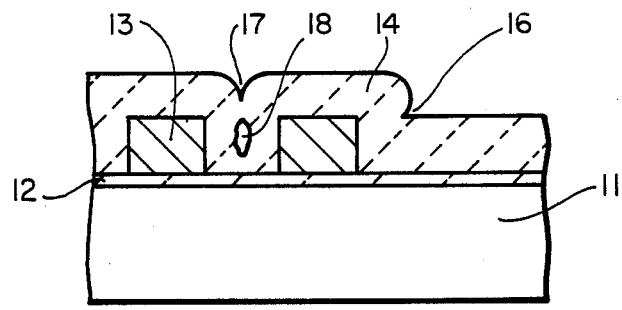
FIG_1
(PRIOR ART)
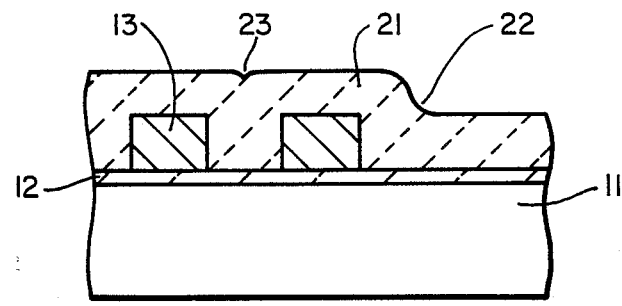
FIG_2
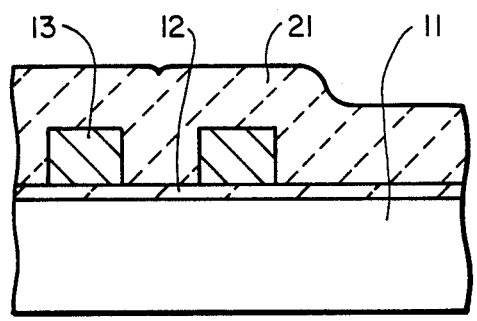
FIG_3
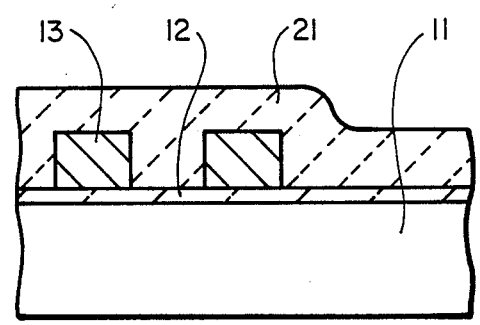
FIG_4

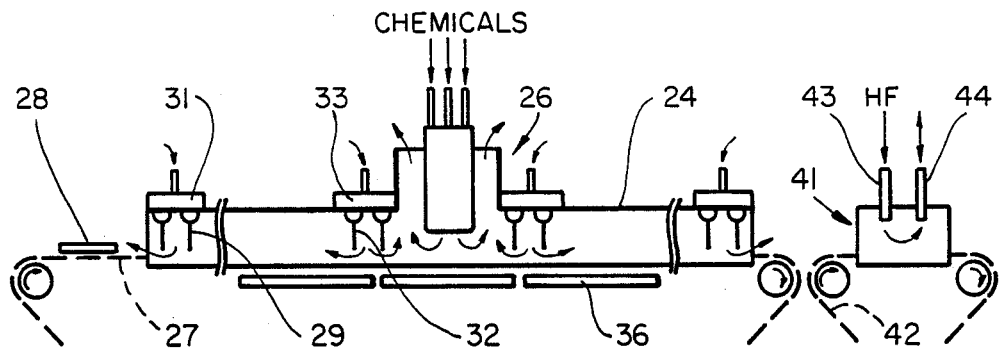
FIG_5
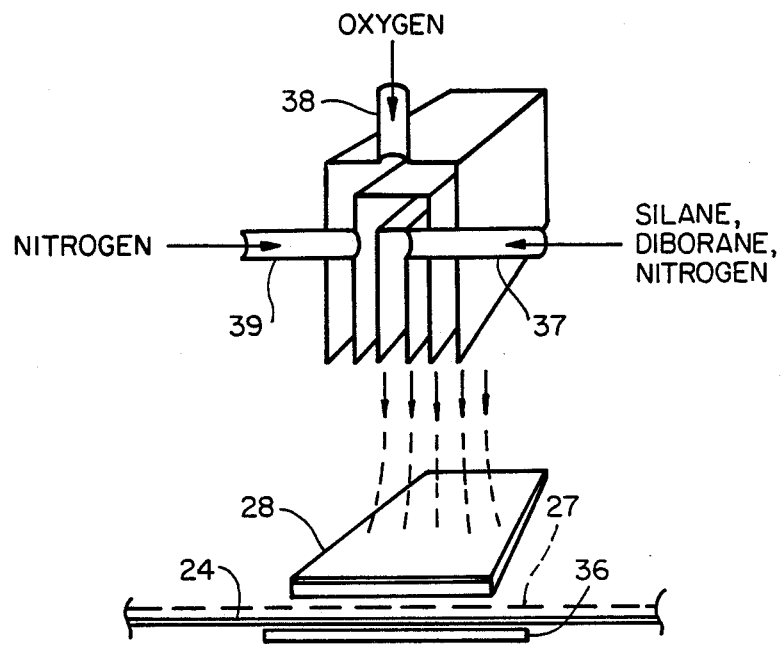
FIG_6

PROCESS FOR BOROSILICATE GLASS FILMS FOR MULTILEVEL METALLIZATION STRUCTURES IN SEMICONDUCTOR DEVICES

This is a continuation of application Ser. No. 907,503 filed Sept. 15, 1986, now abandoned.

This invention relates generally to dielectric films used in semiconductor devices, particularly very large scale (VLSI) devices and more particularly to a method of forming borosilicate glass films having flat surfaces suitable for supporting conductive structures and more particularly to borosilicate films or layers for use in devices having multi-level metallization structures.

A problem encountered in the manufacture of multi-level integrated circuits is that because of the sharp profile of the circuit features such as the conductive interconnects or the insulating surface layers, thin dielectric layers do not conformably cover the edges of the sharply profiled device surfaces. This may result in the migration of interconnect metal through imperfections or pinholes in the dielectric layer. Furthermore, sharp steps or reentrant profiles may prevent complete coverage of the surface by the conductive layer resulting in discontinuities in the interconnect conductors lines formed on the surface of the dielectric layer.

U.S. Pat. No. 4,601,781 describes the foregoing and other problems which have been encountered in the prior art. The patent teaches a method of overcoming the prior art problems by depositing a dielectric layer of phosphosilicate glass to a thickness over the conductors appreciably greater than the thickness of the conductors until sharp profiles are reduced and then etching back the dielectric layer until it has a thickness over the conducting regions comparable to the thickness of the conducting region. This leaves a relatively smooth upper surface where a conductive layer can be applied and etched to leave competent interconnect lines in a multilayer device. The process of the prior art is time consuming because of the relatively thick layers which must be grown and etched.

I have found that a borosilicate glass (BSG) film deposited in a conveyorized atmospheric pressure chemical-vapor-deposition system provides an improved surface suitable for use in many applications without further processing. With the requirements for a surface without sharp steps or reentrant profiles, I have found that the growth of a thicker BSG film followed by an HF etch produces an even better surface.

It is an object of the present invention to provide an improved process for the deposit of dielectric layers on sharply profiled surfaces of semiconductor devices.

It is another object of the present invention to provide an improved process for depositing borosilicate glass films on sharply profiled semiconductor devices.

It is another object of the present invention to provide a borosilicate glass layer for isolating multiconductive layers in a multilayer integrated circuit.

The foregoing and other objects of the invention are achieved by a borosilicate layer which conforms to the sharp profiles of the surface of an integrated circuit and a process for depositing a borosilicate glass layer over the surface of a device having sharply profiled conducting regions which includes the steps of moving the device through one or more atmospheric pressure chambers into which the gases of silane, diborane and oxygen are injected and kept separated by an inert gas until they impinge upon and react at the surface of the heated device to form a borosilicate glass film on the surface.

The invention will be more clearly understood with reference to the accompanying drawings and detailed description in which:

FIG. 1 is a cross-sectional view of a portion of a semiconductor device including a dielectric layer covering sharply defined conductors in accordance with the prior art.

FIG. 2 is a cross-sectional view of a portion of a semiconductor device showing a borosilicate layer formed in accordance with the present invention.

FIG. 3 is a cross-sectional view of a semiconductor device showing a borosilicate layer formed in accordance with the present invention to a thickness greater than the required thickness.

FIG. 4 shows a cross-sectional view of the device of FIG. 3 after etching to reduce the BSG layer to a suitable thickness.

FIG. 5 is a schematic diagram showing a conveyorized atmospheric pressure chemical-vapor-deposition system having a single injection chamber and an etching chamber.

FIG. 6 is a perspective view of an injector for injecting the chemical vapors which react at the surface of the underlying device to form the dielectric layer.

FIG. 1 is a sectional view showing a portion of a semiconductor device including a substrate 11 with an overlying oxide coating 12 upon which are formed conductors 13 which are either adapted to control underlying regions such as regions in a metal oxide field effect device or which may be connected through the oxide to semiconductor device regions formed in the substrate 11. A dielectric layer 14 in accordance with the prior art is shown on the surface of the device. The dielectric layer may, for example, be formed by low pressure chemical deposition or plasma deposition. The layer tends to follow the profile of the underlying conductive members 13 to thereby form sharp reentrant grooves 16 and sharp grooves 17. In integrated circuits having multilevel interconnect structures, a conductive film formed on the surface of the device may not completely fill the reentrant groove 16 or groove 17 and thereby when the device is etched to form semiconductor leads the leads may have gaps or shorts. Furthermore, in certain instances, the grooves may have voids 18.

I have discovered that by forming a borosilicate dielectric layer 21 on the surface of a device the reentrant grooves 16 and 17 are substantially eliminated, as shown at 22 and 23 in FIG. 2. The BSG layer 21 may preferably be formed in a conveyorized atmospheric pressure chemical-vapor-deposition system such as illustrated schematically in FIGS. 5 and 6. The system comprises a muffle 24 which may include a plurality of deposition chambers 26, one of which is shown in FIG. 5. A conveyor belt 27 carries the semiconductor wafer or device 28 into the furnace past flapper doors 29 which include an entry purge chamber 31 through which inert gases flow past the curtains outwardly to essentially seal the interior of the muffle from the atmosphere. The conveyor belt carries the wafer to the deposition chamber 26 which is preceded by flapper doors 32 and a purge chamber 33 which confines the chemicals in the chamber. The wafer is heated by an indirect heating system 36 and enters the deposition chamber 26 where chemical vapors flow inwardly into the chamber and impinge upon the surface of the wafer where they react and deposit the dielectric film.

Referring particularly to FIG. 6, a suitable injector is shown. The injector includes a series of baffles which serve to separate reagents 37 and 38 by an inert separator gas 39 to prevent mixing of the reagents until they impinge upon the heated surface of the wafer 28. At that point, the reagents react and deposit a film.

In the present invention, the reagent may comprise silane, ($SiH_4$), diborane ($B_2H_6$) and oxygen and the separator gas may be nitrogen. When the gases react at the surface they form silicon dioxide, boron oxide and hydrogen or which is purged from the furnace through the vent. The temperature of the wafer may be in the range of 250° to 650° C. The rate of travel of the belt may be in the order of 4 inches per minute. The gas may comprises a mixture of $SiH_4$ and $B_2H_6$ with $B_2H_6$ being between 2.4 and 11.4 percent of the mixture, flowing at about 62.50 cu. cm. per min. with oxygen flow being anywhere from 62.50 to 6,250 cu. cm. per min. In one example, with the above gas flows and one injector chamber, the deposition rate was about 2000 Angstroms per $inch^2$ of BSG per cu. cm. of hydride input/cc.

When it is desired to form a surface with even less pronounced steps or reentrant profiles, the wafer is passed through an etching station. In FIG. 5 the etching station 41 is associated with a transfer conveyor 42. A gas including 1% HF vapor is injected into the etching station chamber via line 43 and removed by line 44. The gas impinges on the surface of the wafer where it etches. However, no condensation is formed on the wafer. Thus, there is only vapor phase etching leaving a smooth surface with no pock marks.

What is claimed is:

1. A process for providing a dielectric layer on a sharply profiled surface of a semiconductor device comprising the steps of elevating the temperature of the device, conveying the device through a deposition chamber, directing silane gas, diborane gas and oxygen into said chamber and on the surface of the heated device where they react and form a borosilicate glass layer on the surface and forming smooth corners in said borosilicate glass layer over said sharply profiled surface of said semiconductor devices.

2. The process of claim 1, including passing the device through an etching chamber provided with HF vapor.

3. The process of claim 1 in which the step of directing silane gas, diborane gas and oxygen includes keeping the silane gas and diborane gas separated from the oxygen until they impinge upon and react at the surface.

4. The process of claim 3 in which the deposition chamber is at atmospheric pressure.

5. The process of claim 1 wherein the temperature of the heated surface is in the range of 250° to 650° C.

* * * * *